United States Patent
Pan et al.

(10) Patent No.: US 11,923,433 B2
(45) Date of Patent: Mar. 5, 2024

(54) FIN FIELD-EFFECT TRANSISTOR AND METHOD OF FORMING THE SAME

(71) Applicant: Taiwan Semiconductor Manufacturing Company, Ltd., Hsinchu (TW)

(72) Inventors: Sheng-Liang Pan, Hsinchu (TW);
Yungtzu Chen, Hsinchu (TW);
Chung-Chieh Lee, Taipei (TW);
Yung-Chang Hsu, Hsinchu (TW);
Chia-Yang Hung, Kaohsiung (TW);
Po-Chuan Wang, Hsinchu (TW);
Guan-Xuan Chen, Hsinchu (TW);
Huan-Just Lin, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 539 days.

(21) Appl. No.: 17/195,967

(22) Filed: Mar. 9, 2021

(65) Prior Publication Data
US 2021/0359104 A1    Nov. 18, 2021

Related U.S. Application Data

(60) Provisional application No. 63/023,468, filed on May 12, 2020.

(51) Int. Cl.
*H01L 29/66* (2006.01)
*H01L 21/02* (2006.01)
*H01L 29/08* (2006.01)
*H01L 29/49* (2006.01)
*H01L 29/78* (2006.01)

(52) U.S. Cl.
CPC .... *H01L 29/6656* (2013.01); *H01L 21/02126* (2013.01); *H01L 21/0217* (2013.01); *H01L 29/0847* (2013.01); *H01L 29/4983* (2013.01); *H01L 29/66545* (2013.01);
(Continued)

(58) Field of Classification Search
CPC ........... H01L 21/02126; H01L 21/0217; H01L 21/28141; H01L 21/823431; H01L 21/823821; H01L 21/845; H01L 27/0886; H01L 27/0924; H01L 27/1211; H01L 29/0653; H01L 29/0847; H01L 29/41791; H01L 29/42392; H01L 29/4983; H01L 29/6653; H01L 29/66545; H01L 29/66553; H01L 29/6656; H01L 29/66636; H01L 29/66795; H01L 29/7848; H01L 29/785;
(Continued)

(56) References Cited

U.S. PATENT DOCUMENTS

2012/0248511 A1* 10/2012 Guo .................... H01L 29/7847
438/303
2013/0273706 A1* 10/2013 Hung .................. H01L 29/7848
438/303

(Continued)

*Primary Examiner* — David C Spalla
(74) *Attorney, Agent, or Firm* — FOLEY & LARDNER LLP

(57) ABSTRACT

A method for manufacturing a semiconductor device includes forming a first dielectric layer over a semiconductor fin. The method includes forming a second dielectric layer over the first dielectric layer. The method includes exposing a portion of the first dielectric layer. The method includes oxidizing a surface of the second dielectric layer while limiting oxidation on the exposed portion of the first dielectric layer.

20 Claims, 14 Drawing Sheets

(52) U.S. Cl.
CPC .. *H01L 29/66636* (2013.01); *H01L 29/66795* (2013.01); *H01L 29/7851* (2013.01)

(58) Field of Classification Search
CPC ............. H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 2015/0249017 A1* | 9/2015 | Raley | H01L 21/31111 438/696 |
| 2020/0044043 A1* | 2/2020 | Hsu | H01L 21/02216 |
| 2020/0105909 A1* | 4/2020 | Wu | H01L 29/7843 |

* cited by examiner

FIN FIELD-EFFECT TRANSISTOR AND METHOD OF FORMING THE SAME

CROSS-REFERENCE TO RELATED APPLICATIONS

This application claims the benefit of and priority to U.S. Provisional Patent App. No. 63/023,468, filed May 12, 2020, the entire disclosure of which is incorporated herein by reference.

BACKGROUND

The present disclosure generally relates to semiconductor devices, and particularly to methods of making a non-planar transistor.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a tri-gate FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
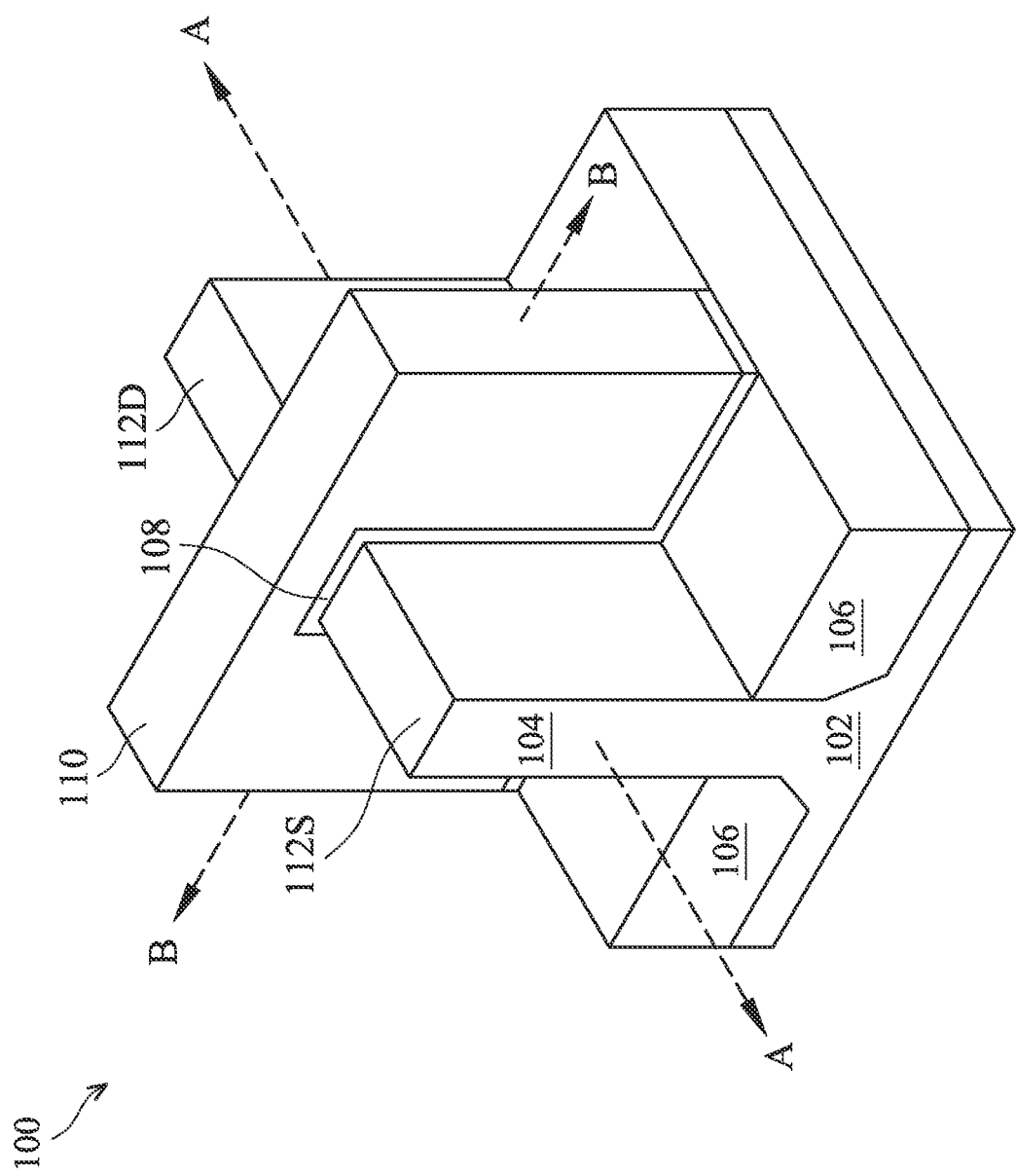
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device. In some embodiments, a dummy gate structure is formed over a fin. A number of seal layers are formed over the dummy gate structure. The seal layers are patterned to form a gate spacer around the dummy gate structure. Next, the gate spacer is treated with a plasma-less process to oxidize the top surface of a topmost one of the seal layers, while minimizing oxidation on the rest of the seal layers. Next, portions of the fin (e.g., the portions on opposite sides of the dummy gate structure, with the gate spacer disposed therebetween) are removed to form source/drain recesses to epitaxially grow source/drain structures therein. After an interlayer dielectric (ILD) layer is formed over the source/drain structures, the dummy gate structure is replaced with an active gate structure (e.g., a metal gate structure).

The above described method provides various advantages to form a FinFET device. For example, to form the source/drain recesses, a photoresist layer is typically formed over the gate spacer, which typically includes a topmost seal layer that includes nitrogen. To avoid the photoresist from being contaminated by the nitrogen (sometimes referred to as $NH_3$ outgassing effect), the topmost seal layer is typically oxidized by a plasma process in the existing technologies. This may cause the underlying seal layer of the gate spacer to oxidize more, partially because the underlying seal layer tends to be more porous (by, e.g., having lower dielectric constant). Such an overly oxidized portion on the underlying seal layer may later be removed during an ashing process that is configured to remove the photoresist layer, which in turn can cause undesirable damage (e.g., loss) to the gate spacer.

By contrast, the disclosed method utilizes a plasma-less process to oxidize the topmost seal layer, while minimizing the oxidation on the underlying seal layer. In some embodiments, various oxygen radicals can be generated by decomposing ozone. The oxygen radicals, generated by such a plasma-lese process, can still oxidize the topmost seal layer, but only oxidize the underlying seal layer, which tends to be oxidized more than the topmost seal layer when using the existing technologies, into a substantially shallow depth. For example, when exposing the topmost seal layer (which tends to be less porous) and the underlying seal layer (which tends to be more porous) to the plasma-less process, an amount of oxidation on the underlying seal layer (e.g., a depth) may be about ten times less than an amount of oxidation on the topmost seal layer. As such, while minimizing the $NH_3$ outgassing effect to occur on the photoresist layer (e.g., by oxidizing the topmost seal layer), the underlying seal layer may remain substantially intact.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source/drain regions 112S and 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S and 112D. Subsequent figures refer to these reference cross-sections for clarity.

Figure 2:
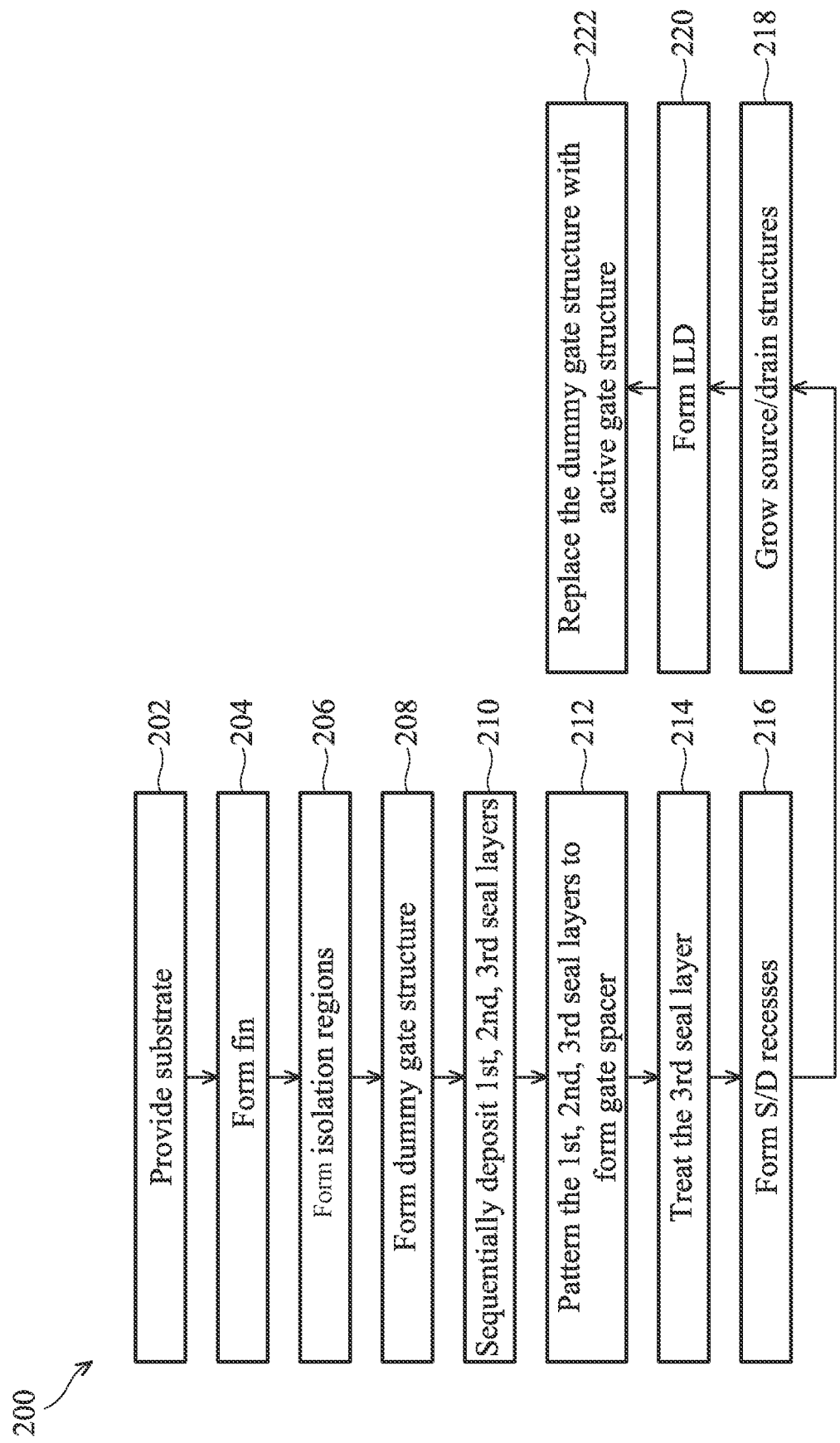
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations of the method 200 can be used to form a FinFET device (e.g., FinFET device 100), a nanosheet transistor device, a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, and 14, respectively, which will be discussed in further detail below.

In brief overview, the method 200 starts with operation 202 of providing a substrate. The method 200 continues to operation 204 of forming a fin. The method 200 continues to operation 206 of forming isolation regions. The method 200 continues to operation 208 of forming a dummy gate structure. The dummy gate structure may straddle a portion of the fin. The method 200 continues to operation 210 of sequentially depositing a first, second, and third seal layer. The method 200 continues to operation 212 of patterning the first, second, and third seal layers to form a gate spacer. The method 200 continues to operation 214 of treating the third seal layer. The method 200 continues to operation 216 of forming source/drain recesses. The method 200 continues to operation 218 of growing source/drain structures. The method 200 continues to operation 220 of forming an interlayer dielectric (ILD). The method 200 continues to operation 222 of replacing the dummy gate structure with an active gate structure.

As mentioned above, FIGS. 3-14 each illustrate, in a cross-sectional view, a portion of a FinFET device 300 at various fabrication stages of the method 200 of FIG. 2. The FinFET device 300 is substantially similar to the FinFET device 100 shown in FIG. 1. Although FIGS. 3-14 illustrate the FinFET device 300, it is understood the FinFET device 300 may include a number of other devices such as inductors, fuses, capacitors, coils, etc., which are not shown in FIGS. 3-14, for purposes of clarity of illustration.

Figure 3:
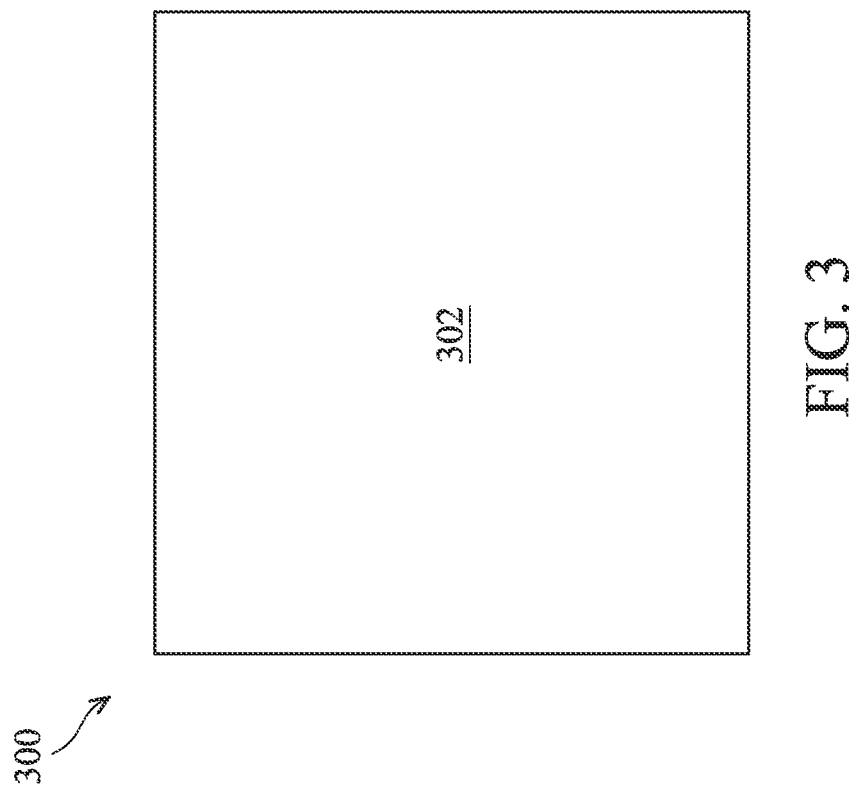
FIGS. 3, 4, 5, 6, 7, 8, 9, 10, 11, 12, 13, and 14 illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along the lengthwise direction of an active/dummy gate structure of the FinFET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
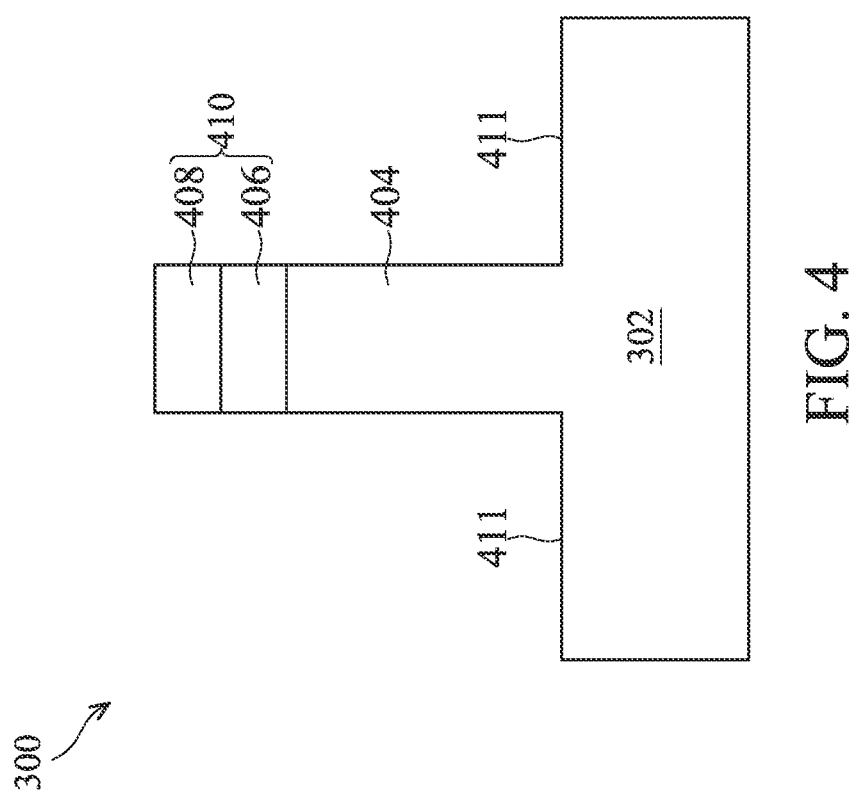

Corresponding to operation 204 of FIG. 2, FIG. 4 is a cross-sectional view of the FinFET device 300 including a (semiconductor) fin 404 at one of the various stages of fabrication. The cross-sectional view of FIG. 4 is cut along the lengthwise direction of an active/dummy gate structure of the FinFET device 300 (e.g., cross-section B-B indicated in FIG. 1).

Although one fin is shown in the illustrated embodiment of FIG. 4 (and the following figures), it should be appreciated that the FinFET device 300 can include any number of fins while remaining within the scope of the present disclosure. In some embodiments, the fin 404 is formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining a fin 404 between adjacent trenches 411 as illustrated in FIG. 4. When multiple fins are formed, such a trench may be disposed between any adjacent ones of the fins. In some embodiments, the fin 404 is formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the fin 404. The fin 404 may also be referred to as fin 404 hereinafter.

The fin 404 may be patterned by any suitable method. For example, the fin 404 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

Figure 5:
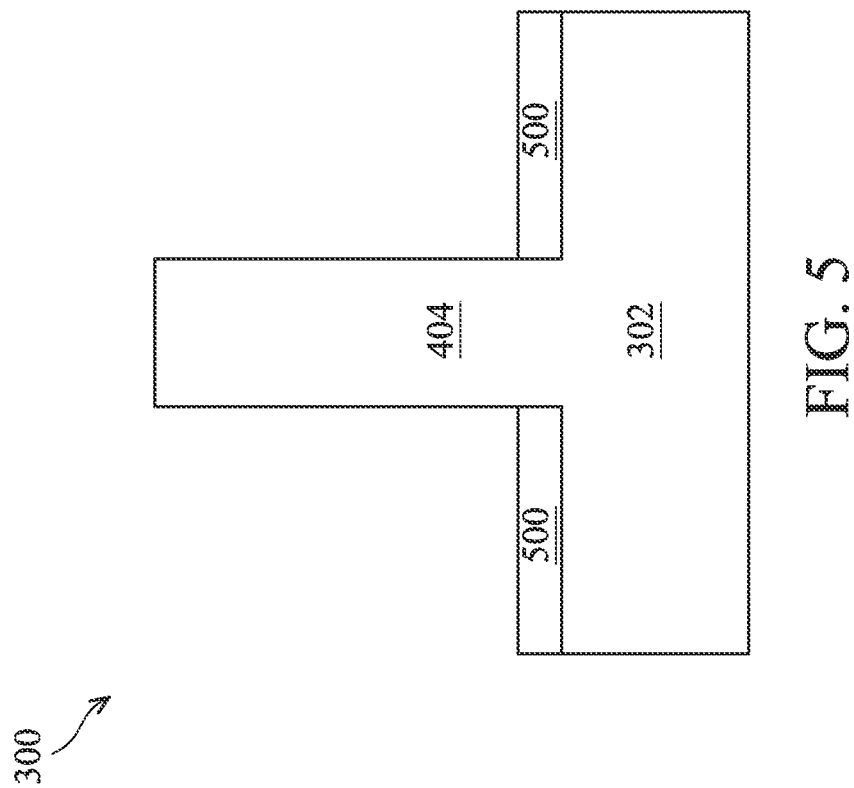

Corresponding to operation 206 of FIG. 2, FIG. 5 is a cross-sectional view of the FinFET device 300 including isolation regions 500 at one of the various stages of fabrication. The cross-sectional view of FIG. 5 is cut along the lengthwise direction of an active/dummy gate structure of the FinFET device 300 (e.g., cross-section B-B indicated in FIG. 1).

The isolation regions 500, which is formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP) process, may remove any excess insulation material and form top surfaces of the isolation regions 500 and a top surface of the fin 404 that are coplanar (not shown). The patterned mask 410 (FIG. 4) may also be removed by the planarization process.

In some embodiments, the isolation regions 500 include a liner, e.g., a liner oxide (not shown), at the interface between each of the isolation regions 500 and the substrate 302 (fin 404). In some embodiments, the liner oxide is formed to reduce crystalline defects at the interface between the substrate 302 and the isolation region 500. Similarly, the liner oxide may also be used to reduce crystalline defects at the interface between the fin 404 and the isolation region 500. The liner oxide (e.g., silicon oxide) may be a thermal oxide formed through a thermal oxidation of a surface layer of the substrate 302, although other suitable method may also be used to form the liner oxide.

Next, the isolation regions 500 are recessed to form shallow trench isolation (STI) regions 500, as shown in FIG. 5. The isolation regions 500 are recessed such that the upper portions of the fin 404 protrude from between neighboring STI regions 500. Respective top surfaces of the STI regions 500 may have a flat surface (as illustrated), a convex surface, a concave surface (such as dishing), or combinations thereof. The top surfaces of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

FIGS. 3 through 5 illustrate an embodiment of forming one or more of the fin 404, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the fin 404 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ doping and implantation doping may be used together. Still further, it may be advantageous to epitaxially grow a material in an NMOS region different from the material in a PMOS region. In various embodiments, the fin 404 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
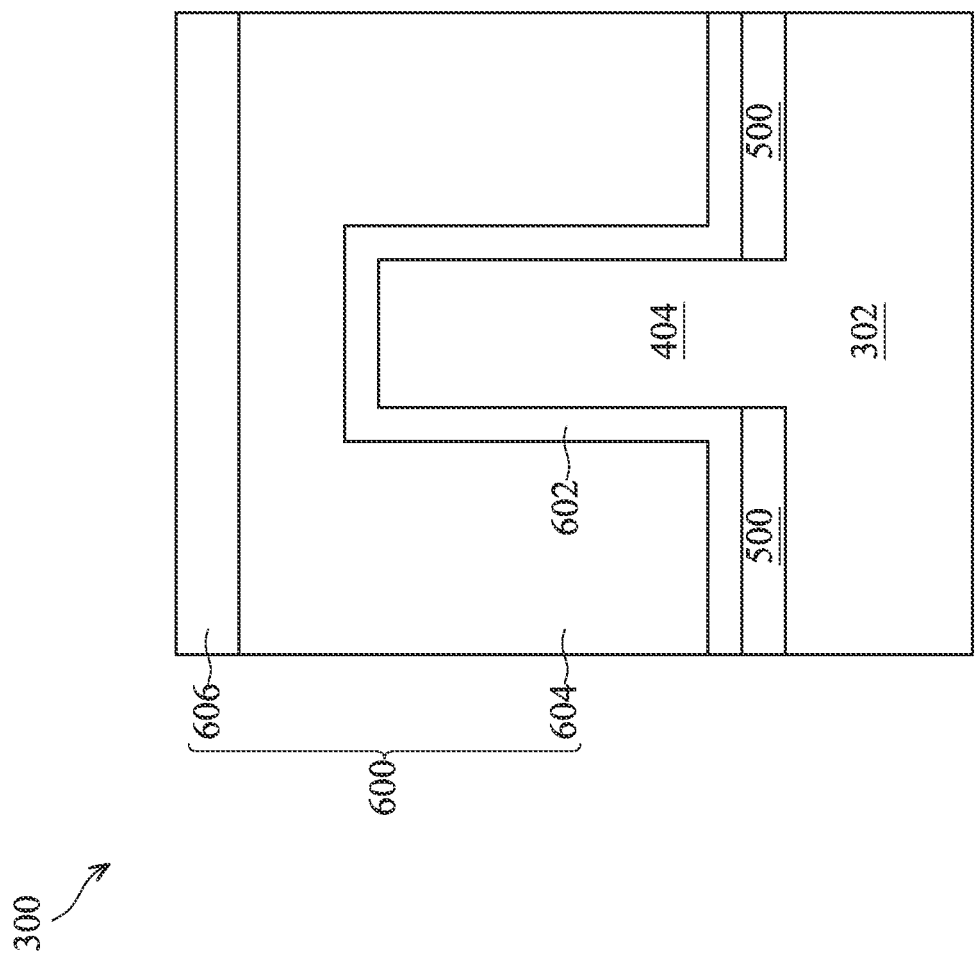

Corresponding to operation 208 of FIG. 2, FIG. 6 is a cross-sectional view of the FinFET device 300 including a dummy gate structure 600 at one of the various stages of fabrication. The cross-sectional view of FIG. 6 is cut along the lengthwise direction of an active/dummy gate structure of the FinFET device 300 (e.g., cross-section B-B indicated in FIG. 1).

The dummy gate structure 600 includes a dummy gate dielectric 602 and a dummy gate 604, in some embodiments. A mask 606 may be formed over the dummy gate structure 600. To form the dummy gate structure 600, a dielectric layer is formed on the fin 404. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP process. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form the mask 606. The pattern of the mask 606 then may be transferred to the gate layer and the dielectric layer by an acceptable etching technique to form the dummy gate 604 and the underlying dummy gate dielectric 602, respectively. The dummy gate 604 and the dummy gate dielectric 602 cover a central portion (e.g., a channel region) of the fin 404. The dummy gate 604 may also have a lengthwise direction (e.g., direction B-B of FIG. 1) substantially perpendicular to the lengthwise direction (e.g., direction of A-A of FIG. 1) of the fin 404.

The dummy gate dielectric 602 is shown to be formed over the fin 404 (e.g., over top surfaces and sidewalls of the fin 404) and over the STI regions 500 in the example of FIG. 6. In other embodiments, the dummy gate dielectric 602 may be formed by, e.g., thermal oxidization of a material of the fin 404, and therefore, may be formed over the fin 404 but not over the STI regions 500. It should be appreciated that these and other variations are still included within the scope of the present disclosure.

Figure 7:
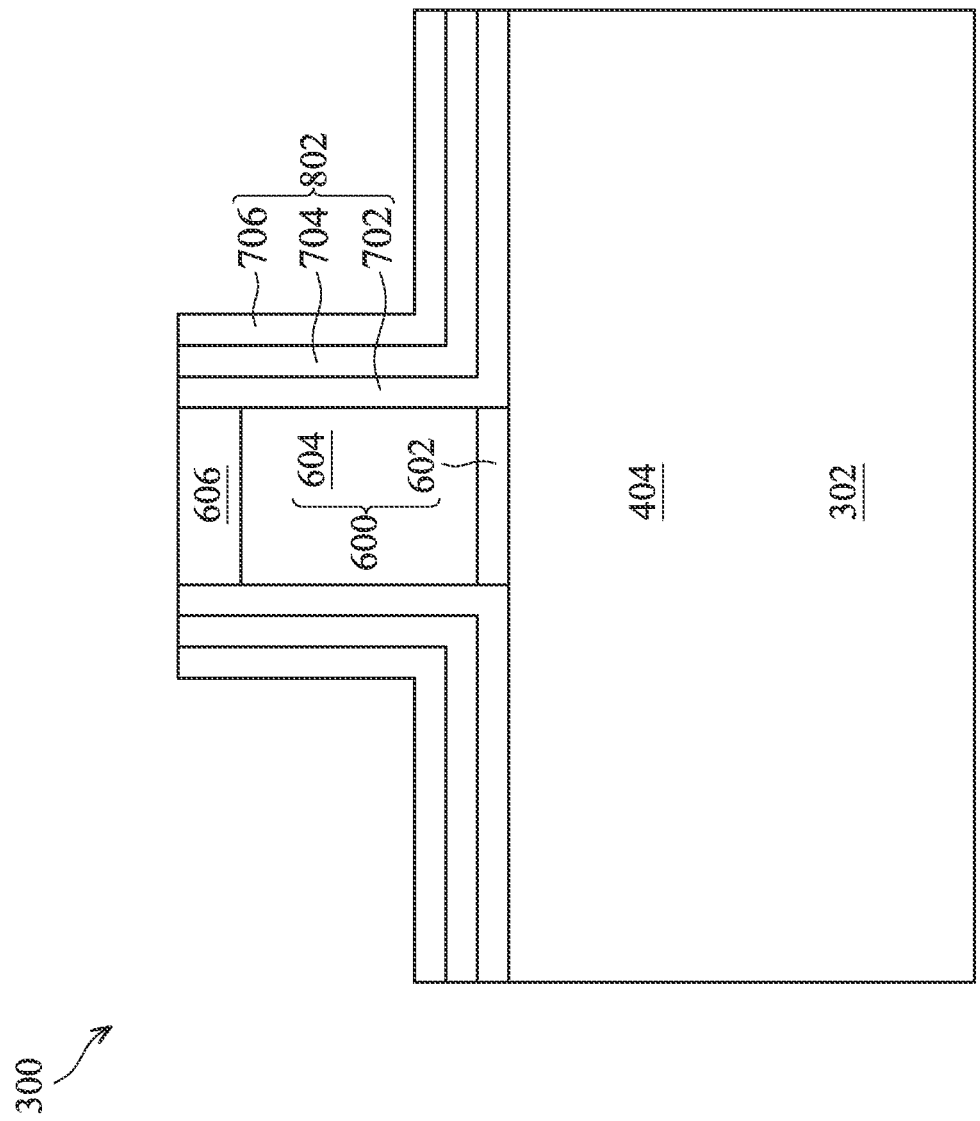

Corresponding to operation 210 of FIG. 2, FIG. 7 is a cross-sectional view of the FinFET device 300 including a first seal layer 702, a second seal layer 704, and a third seal layer 706 at one of the various stages of fabrication. The cross-sectional view of FIG. 7 is cut along the lengthwise direction of a fin of the FinFET device 300 (e.g., cross-section A-A indicated in FIG. 1).

As shown, the first seal layer 702 is formed over the dummy gate structure 600 and the fin 404, the second seal layer 704 is formed over the first seal layer 704, and the third seal layer 706 is formed over the second seal layer 704. Accordingly, the first, second, and third seal layers 702-706 may be sometimes referred to as a bottommost layer, middle layer, and topmost layer, respectively. The first seal spacer 702 may include a dielectric material having a first dielectric constant (typically referred to as a k value, hereinafter IQ), the second seal layer 704 may include a dielectric material having a second dielectric constant (hereinafter $k_2$), and the third seal layer 706 may include a dielectric material having a third dielectric constant (hereinafter $k_3$). In various embodiments, the third dielectric constant ($k_3$) is greater than the first dielectric constant ($k_1$), which is greater than the second dielectric constant ($k_2$). For example, the first seal layer 702 may include a low-k dielectric material (e.g., with $k_1$ about 5) such as, silicon oxycarbonitride (SiOCN), or the like; the second seal layer 704 may include an ultra-low-k dielectric material (e.g., with $k_2$ about 3-4) such as, silicon oxycarbide (SiOC), or the like; and the third seal layer 706 may include a nitride dielectric material (e.g., with $k_3$ about 6) such as, silicon nitride (SiN). Any suitable deposition method, such as thermal oxidation, chemical vapor deposition (CVD), or the like, may be used to sequentially form the first seal layer 702, second seal layer 704, and third seal layer 706.

Figure 8:
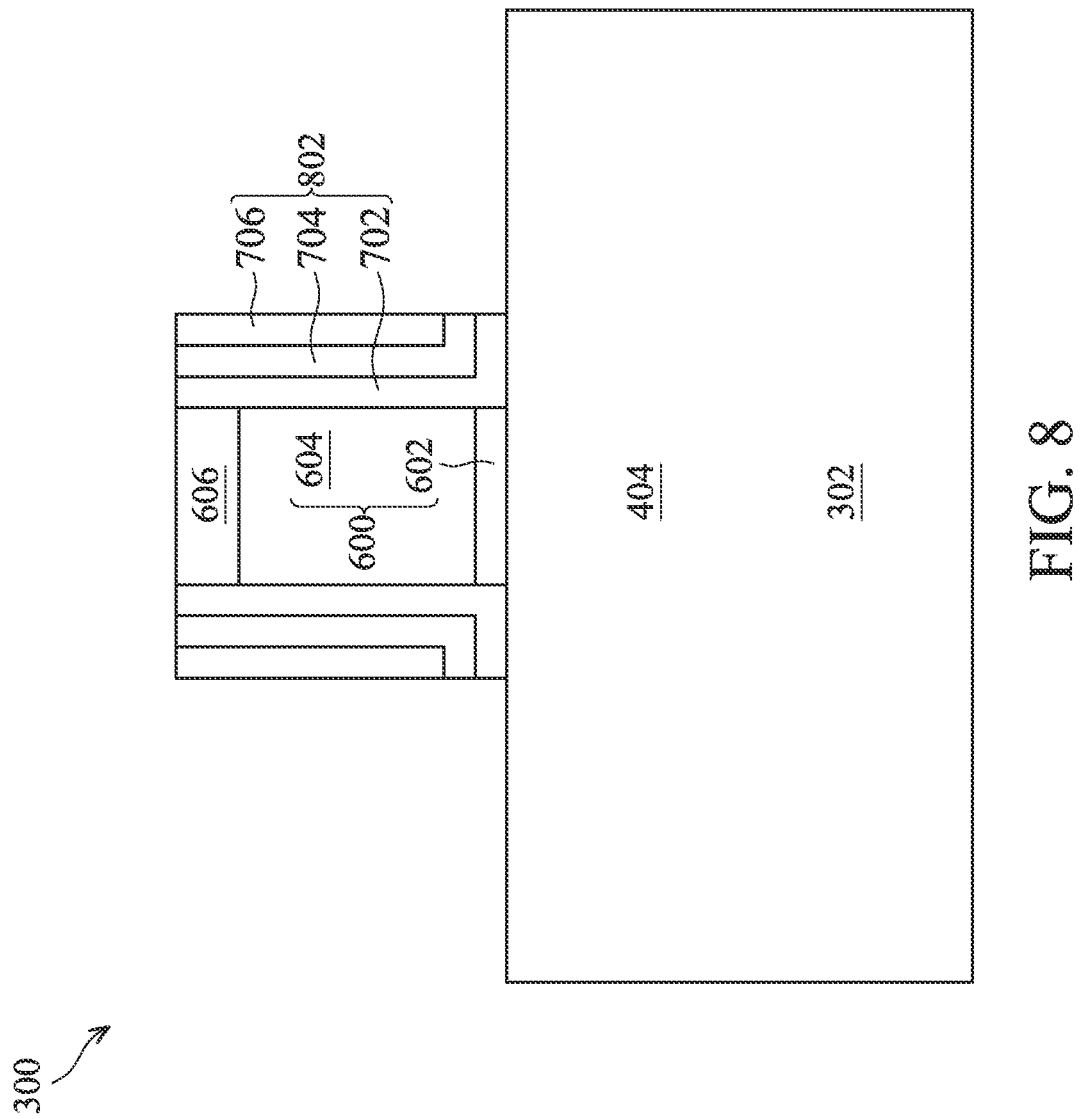

Corresponding to operation 212 of FIG. 2, FIG. 8 is a cross-sectional view of the FinFET device 300 in which the first, second, and third seal layers 702-706 are patterned to form a gate spacer 802 at one of the various stages of fabrication. The cross-sectional view of FIG. 8 is cut along the lengthwise direction of a fin of the FinFET device 300 (e.g., cross-section A-A indicated in FIG. 1).

As shown, the first, second, and third seal layers 702-706 are patterned (e.g., via a dry etching process) to form the gate spacer 802 around the dummy gate structure 600. For example, the gate spacer 802 is formed along sidewalls of the dummy gate structure 600. Specifically, the patterned first and second seal layer 702-704 may each be formed to have an L-shaped profile, with the patterned third seal layer 706 filling up at least a corner portion of the patterned second seal layer 704. In some embodiments, such a corner portion may be referred to as a portion of the patterned seal layer 704 where its vertical and horizontal portion merge. As such, the top surface of a vertical portion and the sidewall of a horizontal portion of the patterned first seal layer 702 can be exposed; the top surface of a vertical portion and the sidewall of a horizontal portion of the patterned second seal layer 704 can be exposed; and the top surface and one of the sidewalls of the patterned third seal layer 706 can be exposed.

Figure 9:
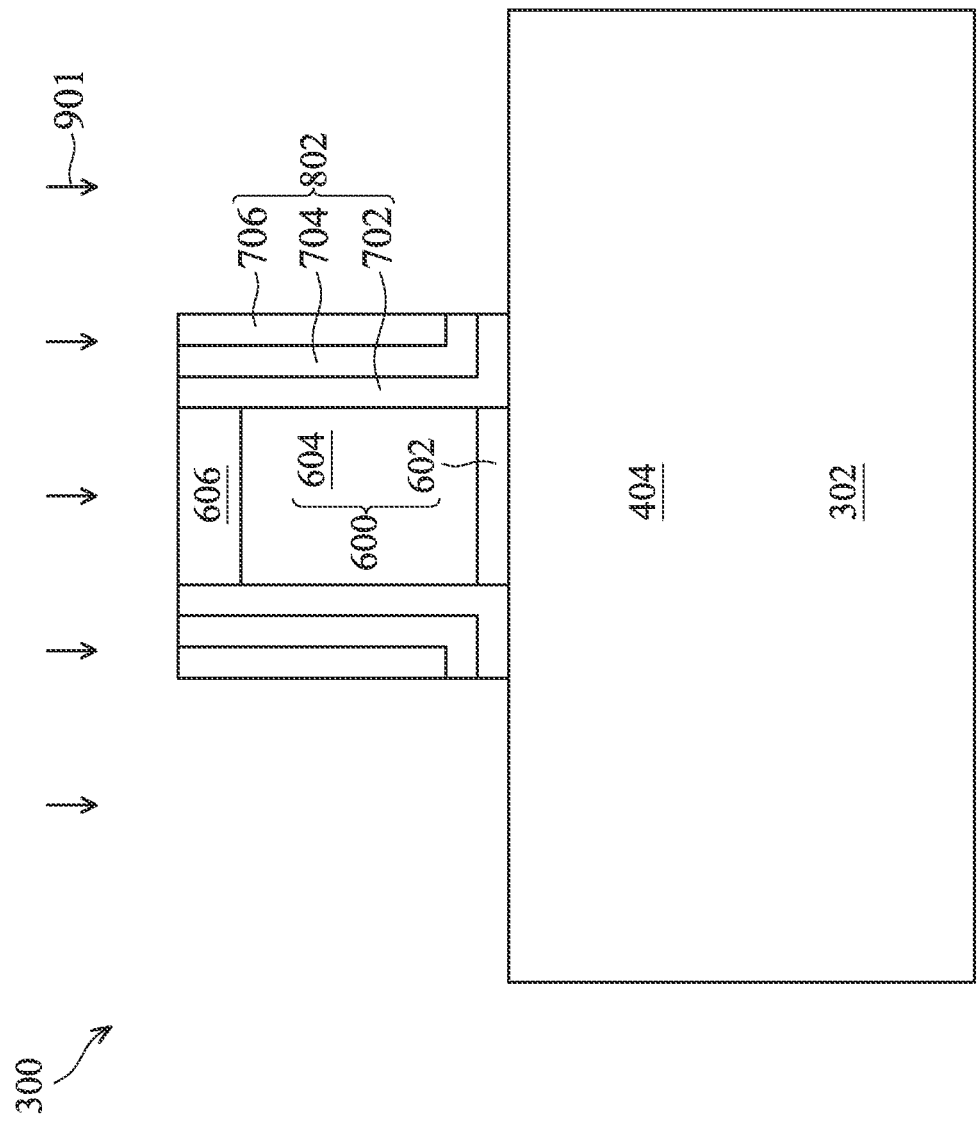
Figure 10:
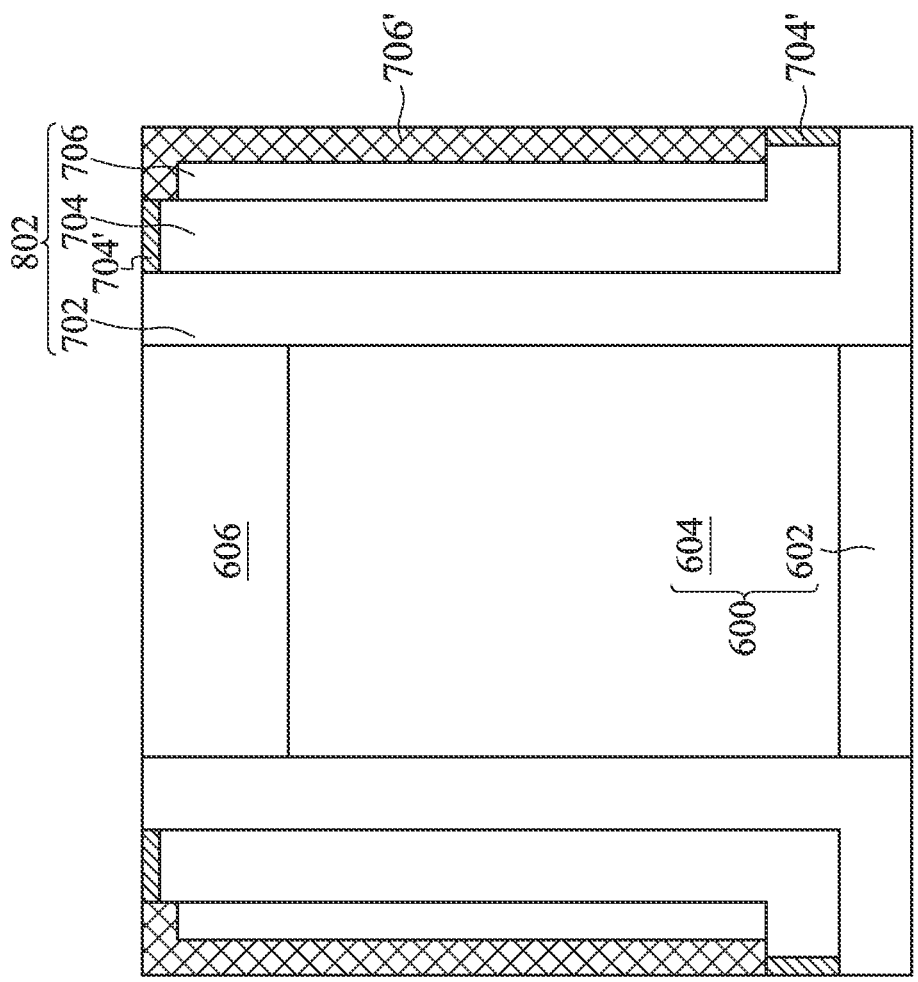

Corresponding to operation 214 of FIG. 2, FIG. 9 is a cross-sectional view of the FinFET device 300 in which an oxidation process 901 is performed on the third seal layer 706 of the gate spacer 802 at one of the various stages of fabrication. FIG. 10 is an enlarged view of FIG. 9. The cross-sectional views of FIGS. 9-10 are each cut along the lengthwise direction of a fin of the FinFET device 300 (e.g., cross-section A-A indicated in FIG. 1).

In various embodiments, the oxidation process 901 includes a plasma-less process (e.g., without applying a high frequency voltage to a plasma electrode), in which ozone ($O_3$) is decomposed into oxygen ($O_2$) and oxygen radicals ($O^*$) at an elevated temperature. For example, the workpiece (e.g., the partially formed FinFET device 300 as shown in FIG. 9) may be placed in the chamber of an apparatus that includes an ozone-containing gas supplier. The ozone-containing gas supplier includes an ozone-containing gas supply source, which is connected with, e.g., an oxygen-containing gas pipe via a flow rate controller and an opening/closing valve. With this configuration, it is possible to supply an ozone-containing gas to inside of the chamber. Example conditions to operate such an apparatus so as to generate the oxygen radicals may include a temperate of at least about 250° C., a processing pressure of about 10~20 Torr, a processing time of about 40 seconds to about 80 seconds, and a flow rate of the ozone gas that is about 3,000~3,500 ppm.

Using such a plasma-less process 901 to generate the oxygen radicals, the exposed surface of the third seal layer 706 may be oxidized, while oxidation on the exposed surfaces on the first and second seal layers 702-704 are significantly limited, as illustrated in the enlarged view of FIG. 10. This may be because $k_3 > k_1 > k_2$. This may further be because the extent of the oxidation process on the seal layers 702-704, driven by the plasma-less process 901, may be determined based on the difference between an oxygen concentration of the exposed surface and a concentration of the oxygen (radicals) in the environment (e.g., the chamber where the process 901 is performed). In the example where the seal layers 702-706 respectively include SiOCN, SiOC, and SiN, as the seal layer 706 presents a greater difference (of the oxygen concentration) than the seal layers 702 and 704, the seal layer 706 may include a surface portion (706') being oxidized with a depth ($H_1$) greater than the depth ($H_2$) of an oxidized surface portion (704') of the second seal layer 704, as shown in FIG. 10. In some embodiments, $H_1$ may range from about 12 to about 18 angstroms, and $H_2$ may range from about 1 to about 2 angstroms. Further, as the seal layer 702 is disposed as the bottommost layer, oxidation on the seal layer 702 may be undetectable.

Figure 11:
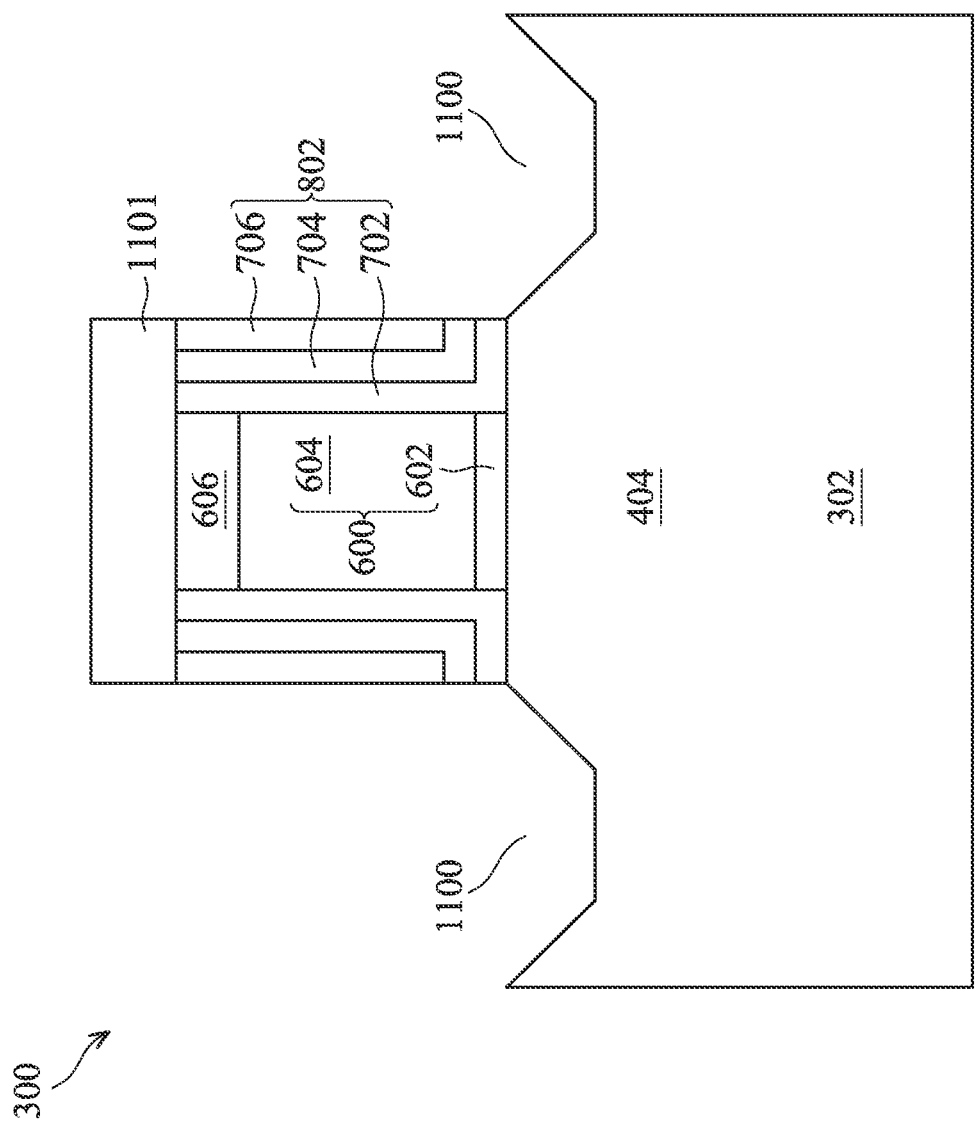

Corresponding to operation 216 of FIG. 2, FIG. 11 is a cross-sectional view of the FinFET device 300 including source/drain recesses 1100 at one of the various stages of fabrication. The cross-sectional view of FIG. 9 is cut along the lengthwise direction of a fin of the FinFET device 300 (e.g., cross-section A-A indicated in FIG. 1).

To form the source/drain recesses 1100, a photoresist layer 1101 is formed over the dummy gate structure 600 and the gate spacer 802 to define respective positions of the source/drain recesses 1100. As the exposed surface of the nitrogen-containing seal layer 706 is oxidized, the photoresist layer 1101 may not be contaminated by the nitrogen. The source/drain recesses 1100 can then be formed by, e.g., an anisotropic etching process using the photoresist layer 1101 as an etching mask, in some embodiments, although any other suitable etching process may also be used. Consequently, the source/drain recesses 1100 can be formed in the fin 404 and disposed on opposite sides of the dummy gate structure 600 (with the gate spacer 802 disposed therebetween), as shown in FIG. 11. After forming the source/drain recesses 1100, the photoresist layer 1101 may be removed by an ashing process using a chemical solution (e.g., hydrofluoric (HF) acid). Through the ashing process, the oxidized portions of the seal layers (e.g., 706' and 704' shown in FIG. 10) may also be removed. Since the oxidation on the underlying seal layers 702-704 is limited, loss to these underlying layers may be limited accordingly.

Although not shown in FIG. 11 and the following figures (for purposes of clarity of illustration), it should be appreciated that during the removal of the photoresist layer 1101, the oxidized portions of the seal layers 706' and 704' may be removed. As such, a horizontal, remaining portion of the seal layer 704 extends farther away from the dummy gate structure 600 than a horizontal, remaining portion of the seal layer 706. Similarly, a vertical, remaining portion of the seal layer 704 extends farther away from the substrate 302 than a vertical, remaining portion of the seal layer 706. Alternatively stated, the seal layer 704 may remain its L-shaped profile, with the third seal layer 706 filling up a portion of the seal layer 704's corner portion.

Figure 12:
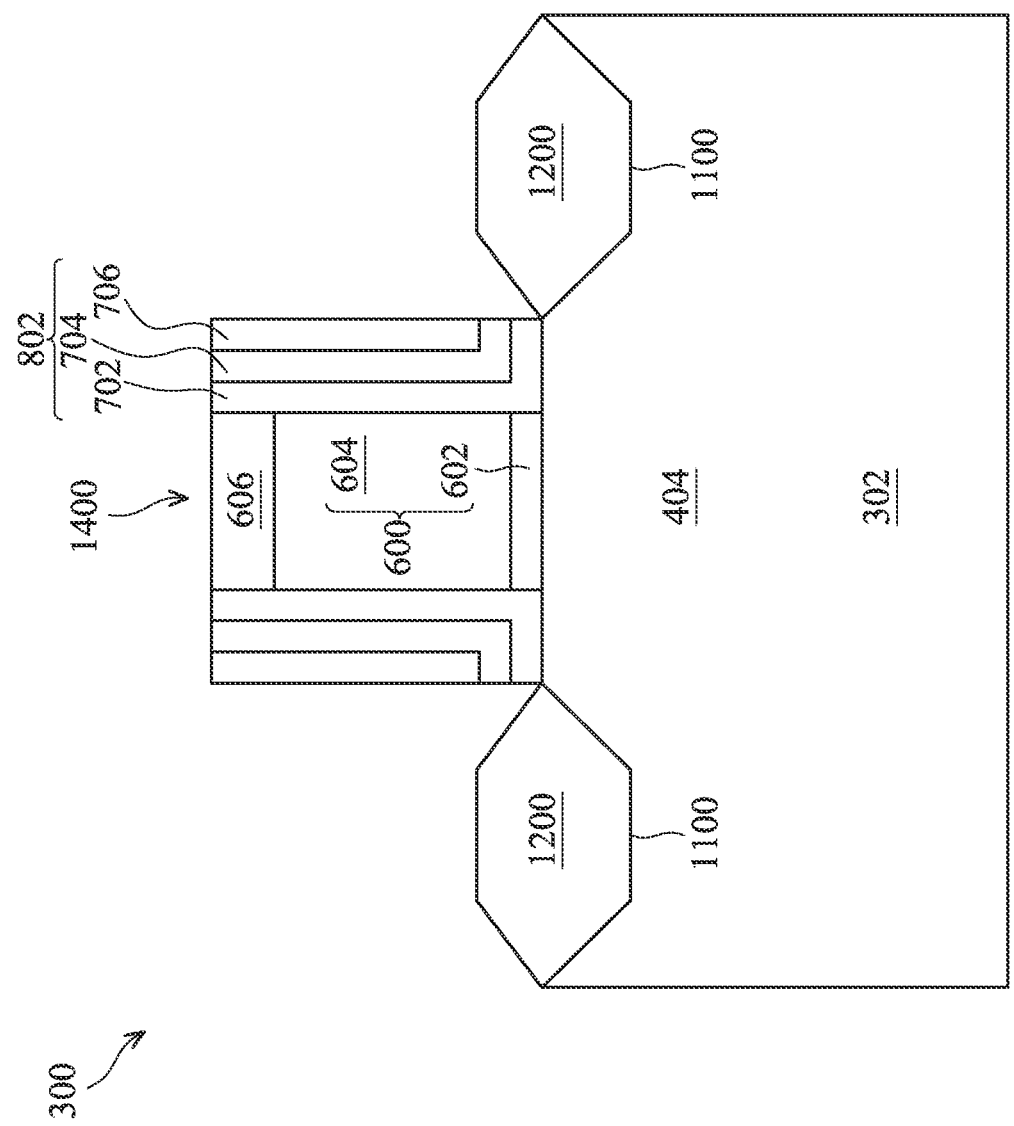

Corresponding to operation 218 of FIG. 2, FIG. 12 is a cross-sectional view of the FinFET device 300 including source/drain structures 1200 at one of the various stages of fabrication. The cross-sectional view of FIG. 12 is cut along the lengthwise direction of a fin of the FinFET device 300 (e.g., cross-section A-A indicated in FIG. 1).

The source/drain structures 1200 are formed in the source/drain recesses 1100, respectively, which are adjacent to the dummy gate structures, e.g., between adjacent dummy gate structures and/or next to a dummy gate structure (e.g., 600). The source/drain structures 1200 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As shown, the epitaxial source/drain structures 1200 may have surfaces raised from a top surface of the fin 404 (e.g. raised above the non-recessed portions of the fin 404) and may have facets. In some embodiments, the source/drain structures 1200 of the adjacent fins may merge to form a continuous epitaxial source/drain region (not shown). In some embodiments, the source/drain structures 1200 of the adjacent fins may not merge together and remain separate source/drain structures (not shown). In some embodiments, when the resulting FinFET device is an n-type FinFET, the source/drain structures 1200 can include silicon carbide (SiC), silicon phosphorous (SiP), phosphorous-doped silicon carbon (SiCP), or the like. In some embodiments, when the resulting FinFET device is a p-type FinFET, the source/drain structures 1200 can include SiGe, and a p-type impurity such as boron or indium.

The epitaxial source/drain structures 1200 may be implanted with dopants to form the source/drain structures 1200, followed by an annealing process. The implanting process may include forming and patterning masks such as a photoresist to cover the regions of the FinFET device 300 that are to be protected from the implanting process. The source/drain structures 1200 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain structures 1200 of a P-type transistor. N-type impurities, such as phosphorous or arsenide, may be implanted in the source/drain structures 1200 of an N-type transistor. In some embodiments, the epitaxial source/drain structures 1200 may be in situ doped during their growth.

Figure 13:
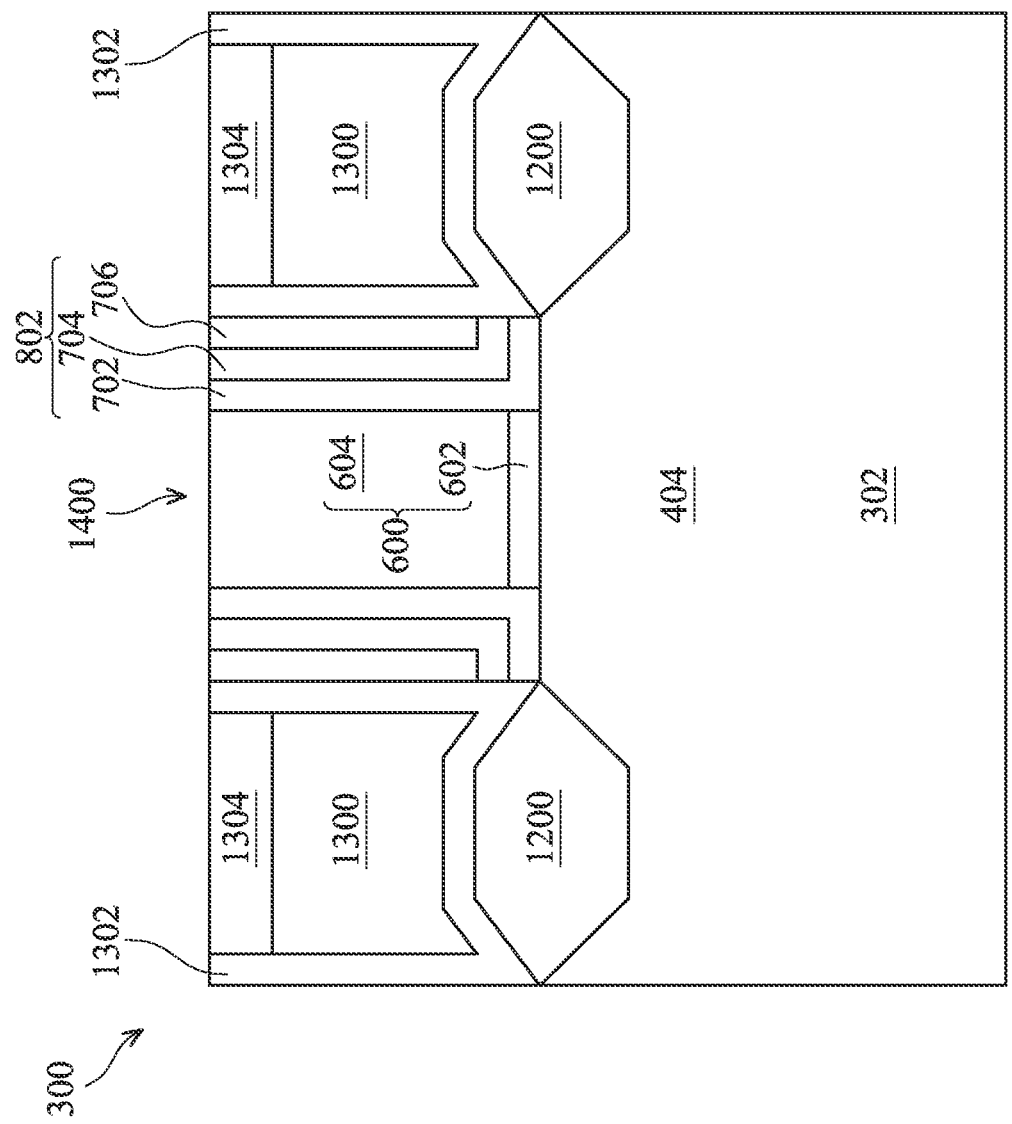

Corresponding to operation 220 of FIG. 2, FIG. 13 is a cross-sectional view of the FinFET device 300 including an interlayer dielectric (ILD) 1300 at one of the various stages of fabrication. The cross-sectional view of FIG. 12 is cut along the lengthwise direction of a fin of the FinFET device 300 (e.g., cross-section A-A indicated in FIG. 1).

Prior to forming the ILD 1300, a contact etch stop layer (CESL) 1302 is formed over the structure illustrated in FIG. 13. The CESL 1302 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1300 is formed over the CESL 1302 and over the dummy gate structure 600. In some embodiments, the ILD 1300 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1300 is formed, a dielectric layer 1304 is optionally formed over the ILD 1300. The dielectric layer 1204 can function as a protection layer to prevent or reduces the loss of the ILD 1300 in subsequent etching processes. The dielectric layer 1404 may be formed of a suitable material, such as silicon nitride, silicon carbonitride, or the like, using a suitable method such as CVD, PECVD, or FCVD. After the dielectric layer 1404 is formed, a planarization process, such as a CMP process, may be performed to achieve a level upper surface for the dielectric layer 1404. The CMP process may also remove the mask 606 (FIG. 12) and portions of the CESL 1302 disposed over the dummy gate 604. After the planarization process, the upper surface of the dielectric layer 1404 is level with the upper surface of the dummy gate 604, in some embodiments.

Figure 14:
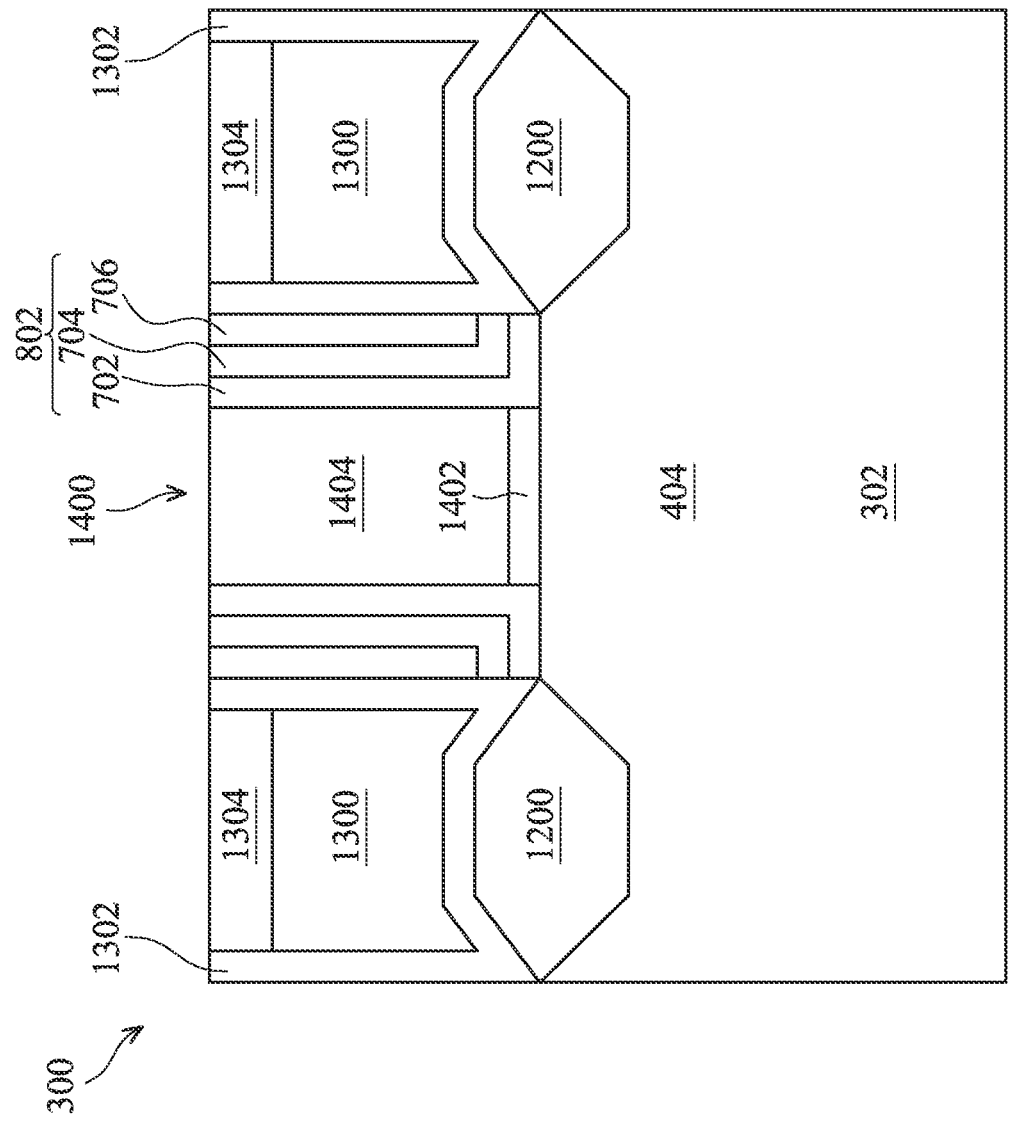

Corresponding to operation 222 of FIG. 2, FIG. 14 is a cross-sectional view of the FinFET device 300 including an active gate structure 1400 at one of the various stages of fabrication. The cross-sectional view of FIG. 12 is cut along the lengthwise direction of a fin of the FinFET device 300 (e.g., cross-section A-A indicated in FIG. 1).

The active gate structure 1400 is formed by replacing the dummy gate structure 600 with a gate dielectric 1402 and a gate metal 1404. The gate dielectric 1402 can straddle the fin 404. The gate dielectric 1402 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric 1402 may include a stack of multiple high-k dielectric materials. The gate dielectric 1402 can be deposited using any suitable method, including, for example, molecular beam deposition (MBD), atomic layer deposition (ALD), PECVD, and the like. In some embodiments, the gate dielectric 1402 may optionally include a substantially thin oxide (e.g., $SiO_x$) layer, which may be a native oxide layer formed on the surface of the fin 404.

The gate metal 1404 can straddle the fin 404 with the gate dielectric 1402 disposed therebetween. The gate metal 1404 may include a stack of multiple metal materials. For example, the gate metal 1404 may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

In one aspect of the present disclosure, a method for manufacturing a semiconductor device is disclosed. The method includes forming a first dielectric layer over a semiconductor fin. The method includes forming a second dielectric layer over the first dielectric layer. The method includes exposing a portion of the first dielectric layer. The method includes oxidizing a surface of the second dielectric layer while limiting oxidation on the exposed portion of the first dielectric layer.

In another aspect of the present disclosure, a method for manufacturing a semiconductor device is disclosed. The method includes depositing a first dielectric layer over a gate structure that straddles a semiconductor fin. The first dielectric layer has a first concentration of oxygen. The method includes depositing a second dielectric layer over the first dielectric layer. The second dielectric layer has a second concentration of oxygen that is less than the first concentration of oxygen. The method includes exposing a portion of the first dielectric layer. The method includes oxidizing a surface of the second dielectric layer while avoiding the exposed portion of the first dielectric layer from being oxidized.

In yet another aspect of the present disclosure, a method for manufacturing a semiconductor device is disclosed. The method includes forming a gate structure to straddle a semiconductor fin. The method includes depositing a first dielectric layer over the gate structure and the semiconductor fin. The method includes depositing a second dielectric layer over the first dielectric layer. The method includes patterning the first and second dielectric layers to form a gate spacer that extends along sidewalls of the gate structure, which exposes a portion of the first dielectric layer. The method includes oxidizing a surface of the second dielectric layer while avoiding the exposed portion of the first dielectric layer from being oxidized.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a first dielectric layer over a semiconductor fin;
    forming a second dielectric layer over the first dielectric layer;
    exposing a portion of the first dielectric layer; and
    oxidizing a surface of the second dielectric layer while limiting oxidation on the exposed portion of the first dielectric layer.

2. The method of claim 1, wherein the first dielectric layer includes silicon oxycarbide, and the second dielectric layer includes silicon nitride.

3. The method of claim 1, further comprising:
    prior to the step of forming a first dielectric layer, forming a dummy gate structure straddling the semiconductor fin; and
    prior to the step of exposing a portion of the first dielectric layer, patterning the first and second dielectric layers to form a gate spacer disposed along sidewalls of the dummy gate structure.

4. The method of claim 3, wherein the step of exposing a portion of the first dielectric layer further comprises etching at least one portion of the semiconductor fin to form a source/drain recess next to the gate spacer.

5. The method of claim 4, further comprising:
    forming a photoresist layer over the oxidized second dielectric layer;
    patterning the photoresist layer to define a region of the source/drain recess;
    removing the patterned photoresist layer using hydrofluoric acid; and
    growing a source/drain structure in the source/drain recess.

6. The method of claim 1, wherein the step of oxidizing a surface of the second dielectric layer while limiting oxidation of the exposed portion of the first dielectric layer further comprises applying, over the second dielectric layer and the exposed portion of the first dielectric layer, oxygen radicals that are generated from ozone.

7. The method of claim 6, wherein the oxygen radicals are generated by decomposing the ozone under a temperature of about 250° C.

8. The method of claim 1, wherein the step of oxidizing a surface of the second dielectric layer while limiting oxidation of the exposed portion of the first dielectric layer further comprises applying, over the second dielectric layer and the exposed portion of the first dielectric layer, oxygen radicals that are not generated through plasma.

9. The method of claim 1, wherein a depth of the oxidation on the exposed portion of the first dielectric layer is less than 2 angstroms.

10. The method of claim 1, wherein the first dielectric layer includes an ultra-low-k dielectric material.

11. A method for manufacturing a semiconductor device, comprising:
    depositing a first dielectric layer over a gate structure that straddles a semiconductor fin, wherein the first dielectric layer has a first concentration of oxygen;

depositing a second dielectric layer over the first dielectric layer, wherein the second dielectric layer has a second concentration of oxygen that is less than the first concentration of oxygen;
exposing a portion of the first dielectric layer; and
oxidizing a surface of the second dielectric layer while avoiding the exposed portion of the first dielectric layer from being oxidized.

12. The method of claim 11, wherein the first dielectric layer includes silicon oxycarbide, and the second dielectric layer includes silicon nitride.

13. The method of claim 11, prior to the step of exposing a portion of the first dielectric layer, further comprising patterning the first and second dielectric layers to form a gate spacer disposed along sidewalls of the gate structure.

14. The method of claim 13, wherein the step of exposing a portion of the first dielectric layer further comprises etching at least one portion of the semiconductor fin to form a source/drain recess next to the gate spacer.

15. The method of claim 14, further comprising:
forming a photoresist layer over the oxidized second dielectric layer;
patterning the photoresist layer to define a region of the source/drain recess;
removing the patterned photoresist layer using hydrofluoric acid; and
growing a source/drain structure in the source/drain recess.

16. The method of claim 11, wherein the step of oxidizing a surface of the second dielectric layer while avoiding the exposed portion of the first dielectric layer from being oxidized further comprises applying, over the second dielectric layer and the exposed portion of the first dielectric layer, oxygen radicals that are generated from ozone.

17. The method of claim 11, wherein a thickness of the oxidation of the exposed portion of the first dielectric layer is less than 2 angstroms.

18. A method for manufacturing a semiconductor device, comprising:
forming a gate structure to straddle a semiconductor fin;
depositing a first dielectric layer over the gate structure and the semiconductor fin;
depositing a second dielectric layer over the first dielectric layer;
patterning the first and second dielectric layers to form a gate spacer that extends along sidewalls of the gate structure, which exposes a portion of the first dielectric layer; and
oxidizing a surface of the second dielectric layer while avoiding the exposed portion of the first dielectric layer from being oxidized.

19. The method of claim 18, wherein the step of oxidizing a surface of the second dielectric layer while avoiding the exposed portion of the first dielectric layer from being oxidized further comprises applying, over the second dielectric layer and the exposed portion of the first dielectric layer, oxygen radicals that are generated from ozone.

20. The method of claim 18, wherein the first dielectric layer has a first concentration of oxygen and the second dielectric layer has a second concentration of oxygen, and wherein the first concentration of oxygen is less than the second concentration of oxygen.

* * * * *